United States Patent [19]
Levinstein et al.

[11] 4,151,007
[45] Apr. 24, 1979

[54] HYDROGEN ANNEALING PROCESS FOR STABILIZING METAL-OXIDE-SEMICONDUCTOR STRUCTURES

[75] Inventors: Hyman J. Levinstein, Berkeley Heights; Ashok K. Sinha, Murray Hill, both of N.J.

[73] Assignee: Bell Telephone Laboratories, Incorporated, Murray Hill, N.J.

[21] Appl. No.: 840,620

[22] Filed: Oct. 11, 1977

[51] Int. Cl.² .............................................. H01I 7/54
[52] U.S. Cl. .................................... 148/1.5; 357/52
[58] Field of Search ........................... 148/1.5; 357/52

[56] References Cited
U.S. PATENT DOCUMENTS
3,852,120  12/1974  Johnson et al. ................. 148/1.5

OTHER PUBLICATIONS
Hofstein; S. R., *Solid State Electronics*, vol. 10, pp. 657-670, 1967, Pergamon Press.

*Primary Examiner*—M. J. Andrews
*Attorney, Agent, or Firm*—Irwin Ostroff

[57] ABSTRACT

Variations in threshold voltage of Metal-Oxide-Silicon (MOS) structures are attenuated by the inclusion in the fabrication process of a hydrogen anneal step using a temperature range of 650 degrees $C \leq T \leq 950$ degrees C. This anneal step is designed to be the last step in the fabrication process which is performed at temperatures above 600 degrees C.

11 Claims, 1 Drawing Figure

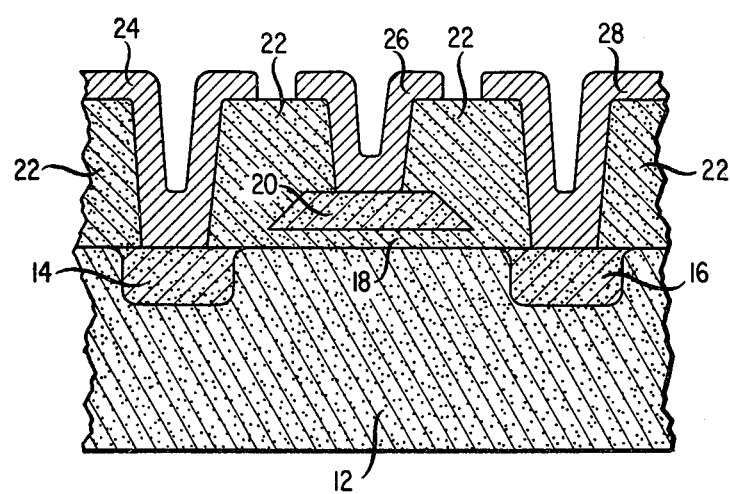

HYDROGEN ANNEALING PROCESS FOR STABILIZING METAL-OXIDE-SEMICONDUCTOR STRUCTURES

BACKGROUND OF THE INVENTION

This invention relates to Metal Oxide Silicon Field Effect Transistors (MOS-FETs) and in particular, to methods for stabilizing drifts in threshold voltage in MOS-FET structures.

Drifts in threshold voltage of MOS-FETs during normal use can constitute a potentially serious threat to the reliability of many of the MOS integrated circuits produced today. One well known cause of such drifts is the mobile charge contamination (particularly sodium contamination) which manifests itself in an increase in the flat band voltage ($V_{FB}$) upon positive bias-temperature aging. The stability of the threshold voltage has been controlled by the use of clean processing techniques including dry HCl oxidation, an intermediate gettering step, and a final passivation layer. Another important source of such threshold voltage drifts especially in, but not limited to [111] silicon-silicon dioxide structures, is the so-called slow-trapping instability. It produces a negative shift in $V_{FB}$ and therefore in the threshold voltage, upon negative bias-temperature aging. It also produces a positive shift in $V_{FB}$ for positive bias-temperature aging, but these shifts are generally smaller than those produced by negative bias-temperature aging. The cause of slow-trapping instability is not completely understood. It has been attributed to hole-trapping in the oxide or to field induced dissociation of additional silicon bonds in partially ionized silicon atoms near the silicon-oxide interface of an integrated circuit.

The publication entitled "Stabilization of MOS Devices" in *Solid State Electronics*, Volume 10, pp. 657-670 (1967), discusses the problem of slow-trapping instability in MOS devices and teaches the use of annealing the devices in dry hydrogen or helium at temperatures between 1,000 and 1,200 degrees C. to negate the effect slow trapping has on threshold voltage changes. A problem with using temperatures over 1,000 degrees C. is that silicon dioxide tends to get reduced by hydrogen at these temperatures. This causes an increase in the oxide fixed charge and an undesirable change in the threshold voltage of the MOS structure. In addition, many of today's MOS integrated circuits (e.g., p-channel 1024 bit RAMs) use boron doped polysilicon, and fabrication temperatures in excess of 1,000 degrees C. cause boron to diffuse into the silicon dioxide. The boron diffusion is enhanced by presence of hydrogen in the ambient. The presence of boron at the oxide-silicon interface reduces the oxide fixed charge and thereby changes the electrical characteristics of the device.

It would be desirable to be able to limit the degrading effect slow trapping has on threshold variations in MOS structures without adding undue complexity to the semiconductor fabrication process.

SUMMARY OF THE INVENTION

The present invention essentially comprises adding a hydrogen heating (annealing) step to an MOS fabrication process at a point in the process after the last step that is to be performed at 600 degrees C. or higher has been completed. The temperature range at which hydrogen anneal step of the present invention is carried out is 650 degrees C. $\leq T \leq$ 950 degrees C.

It has been determined that the inclusion of the hydrogen anneal step of the present invention significantly increases the stability of MOS structures by limiting variations in flat band voltage and threshold voltage during use of the structures. The hydrogen anneal step of the present invention appears to negate the effects of slow trapping and thus to improve the stability of MOS structures.

BRIEF DESCRIPTION OF THE DRAWING

The drawing illustrates an MOS structure which may be fabricated using the process of the present invention.

DETAILED DESCRIPTION

Now referring to the FIGURE there is illustrated a typical semiconductor structure 10 in whose fabrication the present invention may be used. Structure 10 comprises a silicon substrate 12 having a first conductivity type and drain and source regions 14 and 16, which are formed within a portion of 12 and extend to a major surface thereof and have the opposite conductivity type. A silicon dioxide layer 18 exists between the major surface of region 12 and a gate electrode 20. A selective layer of silicon dioxide 22 is illustrated on top of substrate 12 with metallic contacts and interconnections 24, 26, and 28 making contact to region 14, gate 18, and region 16, respectively.

Prior to any deposition of metallic contacts and interconnections 24, 26, and 28, structure 10 is heated (annealed) is essentially pure hydrogen gas at a temperature in the range of 650 degrees C. to 950 degrees C. for a period of time of 30 minutes to two hours at approximately one atmosphere pressure. Subsequently matallic contacts and interconnections 24, 26 and 28 are formed. This annealing step has been found to improve the stability of structure 10 by significantly reducing threshold voltage and flat band voltage variations that occur without the use of the step.

An MOS capacitor very similar to the structure illustrated in the FIGURE, absent the drain and source regions 14 and 16, was tested with respect to flat band voltage changes with applied negative bias (an applied negative field of $2 \times 10^6$ volts/cm) at 250 degrees C. and approximately one atmosphere pressure in a dry nitrogen ambient to determine changes in flat band voltage as a function of time (aging). Time aging at an elevated temperature and applied negative bias has been found to be useful in predicting standard operation of an MOS structure at normal operating temperatures. It had previously been found in devices prepared without the use of the described hydrogen anneal step there was typically a change of 1.9 volts in the flat band voltage in an elapsed time of approximately 1000 minutes. The slope of the curve of the flat band voltage versus time was positive. Under the same conditions, in devices whose preparation differed only in the inclusion of the described hydrogen heating step prior to metallization, it was found that the flat band voltage changed only 0.4 volts and that the slope of the curve of flat band voltage versus time was relatively flat (exhibited little, if any, positive slope).

Changes in threshold voltage correspond to those of flat band voltage and the threshold voltage of a MOS capacitor structure prepared without the hydrogen anneal was 2.4. volts, and was only 0.8 volts when the hydrogen heating step was used.

Why the hydrogen anneal step of the present invention does in fact cause the stabilization of the MOS parameters discussed, is not completely understood; however, it is believed that the moderately high temperature hydrogen anneal relieves the stresses which are present in the dangling bonds at the interface between silicon and silicon dioxide. It is further believed that partially ionized and, therefore strained silicon atoms in the transition region are further ionized by breaking an additional silicon oxygen bond creating positive charge slightly within the oxide transition layer, and additional surface states at the silicon interface. Creation of positive oxide charge and surface stress causes shifts in device threshold voltage and result in slow-trapping instability.

In one embodiment of the structure of the FIGURE of substrate is n-type silicon with a [111] orientation, regions 14 and 16 are p-type regions, gate 18 is an n-type polycrystalline silicon structure, and metallic interconnections and contacts 24, 26 and 28 are aluminum which are electron beam evaporated at 330 degrees C. The temperature used with the hydrogen anneal step of the present invention with this embodiment is nominally 900 degrees C., the time duration of the step is typically one-half to one hour and the pressure is typically approximately one atmosphere.

In another embodiment of the structure of the FIGURE, the parameters indicated for the substrate 12 and regions 14 and 16, metallic interconnections and contacts 22, 24 and 26 are the same as above, however, the gate is p-type boron doped polycrystalline silicon. The temperature used for the hydrogen anneal step of the present invention with this structure is nominally 700 degrees C. and the time duration of the step is typically two hours.

In still another embodiment the substrate 12 is p-type silicon with a [100] orientation, regions 14 and 16 are p-type regions, gate 18 is n-type polycrystalline silicon and metallic interconnections and contacts 24, 26, and 28 are aluminum that are sputter-gun deposited. The temperature used for the hydrogen anneal step for this embodiment is 900 degrees C., the time duration of the step is typically one-half to one hour and the pressure is approximately one atmosphere.

Sputter-gun deposition normally causes damage to MOS structures and variation in threshold voltage in a direction that is similar to that observed for slow trapping. Silicon having a [111] orientation is known to exhibit considerably more slow-trapping instability than silicon having a [100] orientation. The use of the hydrogen anneal step of the present invention with MOS structures which use silicon having a [100] orientation has been found to make these structures considerably more immune to radiation damage from sputter-gun deposition damage.

The beneficial effects of the hydrogen anneal step of the present invention tend to be lost if there are included subsequent processing steps carried out at over 600 degrees C. For example, if the hydrogen anneal step of the present invention is performed immediately after oxidation of silicon and then followed by the deposition of polycrystalline silicon (by pyrolysis of silane at 700 degrees C.), boron diffusion at 1000 degrees C., deposition of an intermediate dielectric (by chemical vapor deposition from tetraethoxy silane at 765 degrees C.) and $POCl_3$ getting at 1000 degrees C., then the device exhibits slow-trapping instability as if there had been no previous hydrogen annealing. Most processing steps carried out above 600 degrees C. in a nonhydrogen ambient ten to negate the effect of a prior hydrogen anneal step that is in accordance with the present invention.

The packaging of completed MOS structures generally does not negate the effects of the hydrogen anneal step of the present invention because the packaging generally is performed at 450 degrees C. or below to protect the metallization of the structure.

The embodiments described herein are intended to be illustrative of the general method of the present invention. Various modifications are possibly consistent with the spirit of the invention. For example, the hydrogen anneal step of the present invention can be utilized in an MOS process just prior to radio frequency glow discharge deposition, etching or sputter deposition and etching. It is believed the pressure during the hydrogen anneal step can be above normal atmospheric pressure.

What is claimed is:

1. In a process of fabricating a semiconductor device, the device comprising a semiconductor substrate having a major surface which is at least partially covered by a layer of silicon dioxide, the last fabrication step in the process which is performed at temperatures of 600 degrees C. or greater being the step of heating the semiconductor device in an ambient of hydrogen gas at a temperature in the range of 650 degrees C.$\leq T \leq$950 degrees C.

2. The process of claim 1 wherein the semiconductor substrate is n-type with a [111] orientation and the process comprises the step of forming a first conductive layer on the silicon dioxide prior to the heating of the semiconductor device in hydrogen and the temperature range during the hydrogen heating step being 850 degrees C.$\leq T \leq$950 degrees C.

3. The process of claim 2 further comprising the step of forming a second conductive layer over the major surface of the semiconductor device, said second conductive layer being formed at a temperature below 600 degrees C. and the first conductive layer being phosphorus doped polycrystalline silicon.

4. The process of claim 3 wherein the second conductive layer is aluminum.

5. The process of claim 2 wherein the first conductive layer is boron doped polycrystalline silicon and the temperature range for the heating of the semiconductor device in hydrogen is 650 degrees C.$\leq T \leq$750 degrees C.

6. The process of claim 5 wherein the second conductive layer is aluminum.

7. The process of claim 1 wherein the semiconductor substrate is p-type silicon with a [100]orientation and a first conductive layer is selectively formed on the silicon dioxide prior to the heating of the semiconductor device in hydrogen and the temperature range of the heating step is 850 degrees C.$\leq T \leq$950 degrees C.

8. The process of claim 1 further comprising the step of forming a second conductive layer on the semiconductor device at a temperature below 600 degrees C. and the first conductive layer being phosphorus doped polycrystalline silicon.

9. The process of claim 8 wherein the second conductive layer is aluminum and is deposited by magnetron sputtering.

10. In a process of fabricating a semiconductor device, the device comprising a semiconductor substrate having a major surface which is at least partially covered by a layer of silicon dioxide, the last fabrication step in the process which is performed at temperatures of 600 degrees C. or greater being the step of heating the semiconductor device in an ambient of hydrogen gas at a temperature in the range of 650 degrees $C. \leq T \leq 950$ degrees C., the hydrogen heating step being performed prior to metallization of the device.

11. The process of fabricating an MOS silicon device which is characterized in that the last step in the processing which involves heating the device to a temperature above 600 degrees C. is a step in which the device is heated to a temperature of between 650 degrees C. and 950 degrees C. for approximately a half hour or greater in an ambient which consists essentially of hydrogen gas.

* * * * *